United States Patent
Okada

(10) Patent No.: US 8,039,809 B2
(45) Date of Patent: Oct. 18, 2011

(54) SENSOR PANEL AND IMAGE DETECTING DEVICE

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 321 days.

(21) Appl. No.: 12/232,639

(22) Filed: Sep. 22, 2008

(65) Prior Publication Data

US 2009/0084938 A1   Apr. 2, 2009

(30) Foreign Application Priority Data

Sep. 27, 2007   (JP) ................. 2007-251496

(51) Int. Cl.
*H01L 27/00* (2006.01)
*G01T 1/24* (2006.01)

(52) U.S. Cl. ................. 250/370.09; 250/208.1

(58) Field of Classification Search ............. 250/370.09, 250/214 R, 208.1
See application file for complete search history.

(56) References Cited

U.S. PATENT DOCUMENTS

| | | | | |
|---|---|---|---|---|
| 5,610,403 A | * | 3/1997 | Kingsley et al. | 250/370.09 |
| 5,610,404 A | * | 3/1997 | Possin | 250/370.09 |
| 5,648,674 A | * | 7/1997 | Weisfield et al. | 257/428 |
| 5,693,947 A | * | 12/1997 | Morton | 250/370.09 |
| 5,777,335 A | * | 7/1998 | Mochizuki et al. | 250/370.09 |
| 6,225,632 B1 | * | 5/2001 | Kinno et al. | 250/370.09 |
| 6,724,855 B2 | * | 4/2004 | Sugawara et al. | 378/19 |
| 7,112,800 B2 | * | 9/2006 | Sato et al. | 250/370.09 |

FOREIGN PATENT DOCUMENTS

JP   A 11-68078   3/1999

* cited by examiner

*Primary Examiner* — Tony Ko
(74) *Attorney, Agent, or Firm* — Sheldon J. Moss; Chad M. Herring

(57) ABSTRACT

The present invention provides a sensor panel and an image detecting device that can suppress generation of artifacts and an increase in noise. A sensor panel has an image detecting region formed from plural image sensor portions, data lines reading signals out from the image sensor portions, bidirectional diodes disposed at a peripheral edge of the image detecting region and connected to the data lines, and, at an upper layer of the bidirectional diodes, a semiconductor film that generates charges due to irradiation of electromagnetic waves. At the sensor panel, shield electrodes, that are connected to a common line, are disposed between the bidirectional diodes and the semiconductor film.

7 Claims, 14 Drawing Sheets

SENSOR PANEL AND IMAGE DETECTING DEVICE

CROSS-REFERENCE TO RELATED APPLICATION

This application claims priority under 35 USC 119 from Japanese Patent Application No. 2007-251496, the disclosure of which is incorporated by reference herein.

BACKGROUND

1. Technical Field

The present invention relates to a sensor panel and an image detecting device, and in particular, to a sensor panel provided with an electrostatic protective circuit that protects a circuit due to current flowing through when overvoltage is generated, and to an image detecting device using this sensor panel.

2. Related Art

Radiation image detecting devices, such as FPDs (flat panel detectors) and the like in which an X-ray sensitive layer is disposed on a TFT (thin film transistor) active matrix substrate and which can convert X-ray information directly into digital data, have been put into practice in recent years. As compared with a conventional imaging plate, an FPD has the advantages that an image can be confirmed immediately and that video images as well can be confirmed, and the popularization of FPDs has advanced rapidly.

In this type of radiation image detecting device, it is important to detect an X-ray image at a size that projects a human body, and therefore, substrates of large sizes exceeding 30×30 cm are needed. However, it is difficult to manufacture a substrate of such a large size from a silicon substrate. Therefore, currently, TFT active matrix substrates that are formed on a thin plate glass are mainly being used.

TFT active matrix substrates are employed as driving substrates for LCDs (liquid crystal displays), and are stable technologically and in terms of cost as well. Therefore, TFT array substrates for image detecting devices as well are mainly manufactured on assembly lines for TFTs for LCDs from the standpoint of cost.

A circuit diagram of a conventional TFT active matrix substrate 10' for an image detecting device is shown in FIG. 11.

As shown in FIG. 11, the TFT active matrix substrate 10' is structured such that a large number of pixels are arrayed in a two-dimensional form. The pixel is structured to include a charge collecting electrode 11' that collects charges generated at an image sensor portion (not illustrated), a charge storage capacitor 5' storing detected charge signals, and a thin film transistor (hereinafter called "TFT switch") 4' for reading-out the charges stored in the charge storage capacitor 5'. Further, plural scan lines 101' for turning the TFT switches 4' on and off, and plural data lines 3' for taking-out the charges stored in the charge storage capacitors 5', are provided at the TFT active matrix substrate 10'. One electrode of each of the charge storage capacitors 5' is grounded via a line (not illustrated) and is made to be ground level. Note that, in FIG. 11, the one electrode of the charge storage capacitor 5' is illustrated as being connected to ground.

The respective data lines 3' and the respective scan lines 101' of the TFT active matrix substrate 10' are connected to a common line 110' via bidirectional diodes 30' for circuit protection respectively, in order to prevent electrostatic breakage at the time of manufacturing.

An example of the structure of one diode 31' that structures this conventional bidirectional diode 30' is shown in FIG. 12.

In a TFT active matrix substrate that uses an amorphous silicon TFT, the diode 31' can be structured easily by connecting the gate electrode and the drain electrode of the TFT switch, as shown in FIG. 12.

FIG. 13 shows an equivalent circuit focusing on one TFT element of the TFT active matrix substrate 10' shown in FIG. 12.

As shown in FIG. 13, at each TFT element of the TFT active matrix substrate 10', between the gate electrode and the data electrode of the TFT switch 4' is equivalent to being connected by the bidirectional diode 30' that is structured by the anodes and cathodes of two of the diodes 31' respectively being connected to one another in parallel. Therefore, if the electrode potential of one becomes high, charges flow to the other, and the potential can be prevented from becoming high.

In the bidirectional diode 30', it is important that, at the time of manufacturing, sufficient current flow (the bidirectional diode 30' be low resistance) in order to protect the TFT active matrix substrate 10', whereas on the other hand, at the time of image detection, in order to suppress noise and artifacts, it is important to not to flow the leak current. For this purpose, as shown in FIG. 11, it is usually the case that the bidirectional diodes 30' are inserted between the common line 110', and the respective data lines 3' and the respective scan lines 101'. Because the resistance value of the bidirectional diode 30' varies greatly due to the potential difference between the two terminals, the aforementioned characteristic can be obtained.

However, in a case in which the bidirectional diode 30' of such a structure is applied to a radiation image detecting device, the charges generated by the irradiation of X-rays and the like are stored between the photoelectric conversion layer and the interlayer insulating film. It is clear that, due thereto, there are cases in which the TFT element structuring the bidirectional diode 30' malfunctions.

This phenomenon will be described in further detail hereinafter.

An example of the layer structures of a pixel portion, that detects an image, and the bidirectional diode 30' portion of the TFT active matrix substrate 10' is shown in FIG. 14.

In a direct-conversion-type radiation image detecting device in which a semiconductor film 6' of Se or the like is formed as a photoelectric conversion layer on the TFT active matrix substrate 10', a bias electrode 7' is provided at the top layer of the semiconductor film 6'. By applying high voltage to the semiconductor film 6', the semiconductor film 6' works as a photoelectric converting element. For example, in the case of the semiconductor film 6' which is mainly Se, high voltage of around 1 to 10 kV is applied to the Se film whose film thickness is about 0.1 to 1 mm.

On the other hand, also above the bidirectional diode 30' at which the charge collecting electrode 11' does not exist, almost all of the voltage that is applied to the bias electrode 7' is applied to the semiconductor film 6'. For example, in a case in which the Se is 1 mm (relative permittivity of 7), an interlayer insulating film 12' is 2 mm (relative permittivity of 3.5) and the voltage applied to the bias electrode 7' is 10 kV, greater than or equal to 990 V is applied to the Se layer.

In this state, when X-rays are irradiated, charges are generated also at the semiconductor film 6' above the bidirectional diode 30', in the same way as at the pixel portion. However, because there is no flow-out destination for charges above the bidirectional diode 30', the generated charges are stored and are held at the defect level within the semiconductor film 6', or at the interface between the semiconductor film 6' and the interlayer insulating film 12'. Due thereto, the potential becomes high at the upper layer portion of the bidirectional diode 30', and voltage is applied via the interlayer insulating film 12' to the channel portion of the TFT element structuring the bidirectional diode 30'. In this way, at the TFT element, operation that is similar to a case of applying bias to the back gate is brought about due to the defect level of the interface, and the resistance value decreases.

Originally, high resistance must be maintained without current flowing at the bidirectional diode 30', except for cases in which high voltage is applied to the signal line for protection at the time of image detection.

However, when the charge amount stored at the interlayer insulating film 12' becomes large, the resistance value of the bidirectional diode 30' becomes low regardless of the voltage of the line. Leak current is generated via the bidirectional diode 30', and becomes a cause of the occurrence of artifacts and an increase in noise.

Note that, as related art, Japanese Patent Application Laid-Open (JP-A) No. 11-68078 discloses a structure of covering a driving means by shield electrodes in order to prevent electrostatic breakage.

However, the technique of JP-A No. 11-68078 restricted to the covering of a driving means by shield electrodes, and cannot prevent the occurrence of malfunctioning of an electrostatic protective circuit. Therefore, there is the problem that generation of artifacts and an increase in noise cannot be suppressed.

SUMMARY

The present invention is to overcome the above-described problem, and is to provide a sensor panel and an image detecting device that can suppress the generation of artifacts and an increase in noise.

According to a first aspect of the present invention, there is provided a sensor panel including: an image detecting region formed from a plurality of electromagnetic wave detecting elements; data lines reading signals out from the electromagnetic wave detecting elements; an electrostatic protective circuit disposed at a peripheral edge of the image detecting region, and connected to the data lines; and, at an upper layer of the electrostatic protective circuit, a photoelectric conversion layer generating charges due to irradiation of electromagnetic waves, wherein shield electrodes that are connected to a common line are disposed between the electrostatic protective circuit and the photoelectric conversion layer.

The sensor panel of the first aspect has the image detecting region that is formed from a plurality of electromagnetic wave detecting elements, the data lines that read-out signals from the electromagnetic wave detecting elements, the electrostatic protective circuit that is disposed at a peripheral edge of the image detecting region and is connected to the data lines, and, at an upper layer of the electrostatic protective circuit, a photoelectric conversion layer that generates charges due to the irradiation of electromagnetic waves.

At the sensor panel of the first aspect, the shield electrodes that are connected to a common line are disposed between the electrostatic protective circuit and the photoelectric conversion layer.

Accordingly, in accordance with the first aspect, due to the charges, that are stored at the photoelectric conversion layer without being collected, being collected by the shield electrodes, a decrease in the resistance value of the electrostatic protective circuit is suppressed, and generation of leak current via the protective circuit can be suppressed. Therefore, generation of artifacts and an increase in noise can be suppressed.

Note that, as in a second aspect, the first aspect may further include a plurality of scan lines at which flow control signals that control reading of signals out from the electromagnetic wave detecting elements to the plurality of data lines, and a plurality of the electrostatic protective circuits may be provided so as to be individually connected respectively to the plurality of scan lines.

Further, as in a third aspect, the first aspect or the second aspect may further include a plurality of collecting electrodes that collect, at the electromagnetic wave detecting elements, charges that are generated at the photoelectric conversion layer, and the shield electrodes and the collecting electrodes may be formed of the same material and at the same layer.

On the other hand, an image detecting device of a fourth aspect of the present invention includes: any one of the sensor panels of the first through third aspects; and detecting means for detecting an image, that is an object of detection, on the basis of charge amounts detected via a plurality of data lines of the sensor panel when electromagnetic waves expressing the image are irradiated onto the sensor panel.

Accordingly, in accordance with the fourth aspect, good images can be obtained because the occurrence of artifacts and an increase in noise can be suppressed.

In this way, the present invention has the excellent effect that, due to the charges, that are stored at the photoelectric conversion layer without being collected, being collected by the shield electrodes, a decrease in the resistance value of the electrostatic protective circuit is suppressed, and as a result, generation of leak current via the protective circuit can be suppressed. Therefore, the occurrence of artifacts and an increase in noise can be suppressed.

BRIEF DESCRIPTION OF THE DRAWINGS

Exemplary embodiments of the present invention will be described in detail based on the following figures, wherein.

DETAILED DESCRIPTION

Exemplary embodiments of the present invention will be described hereinafter with reference to the drawings. Note that, in the following description, a case will be described in which the present invention is applied to a radiation image detecting device 100 in which an X-ray sensitive layer is formed on a TFT active matrix substrate and which converts X-ray information directly into digital data.

First Exemplary Embodiment

Figure 1:
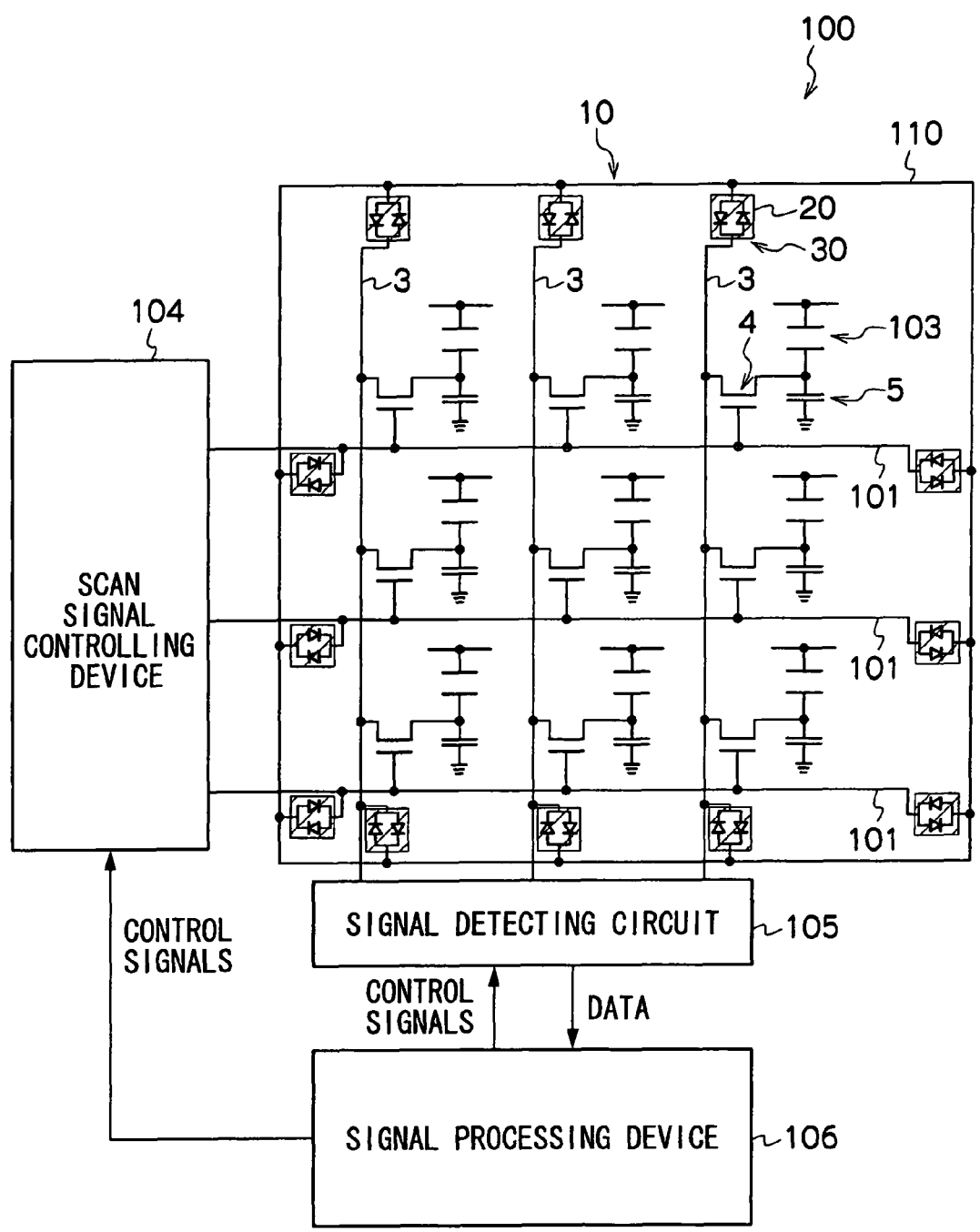
FIG. 1 is a structural drawing showing the overall structure of a radiation image detecting device relating to first and second exemplary embodiments.

The overall structure of the radiation image detecting device 100 relating to an exemplary embodiment of the present invention is shown in FIG. 1.

As shown in FIG. 1, the radiation image detecting device 100 relating to the present exemplary embodiment has a TFT active matrix substrate 10.

A large number of pixels are provided in a two-dimensional form at the TFT active matrix substrate 10. The pixel is structured to include: an image sensor portion 103 structured from a bias electrode, a semiconductor film, and a charge collecting electrode that will be described later; a charge storage capacitor 5 that store charge signals detected at the image sensor portion 103; and a TFT switch 4 for reading-out the charges stored in the charge storage capacitor 5.

Plural scan lines 101 for turning the TFT switches 4 on and off, and plural data lines 3 for reading-out the charges stored in the charge storage capacitors 5, are provided at the TFT active matrix substrate 10. One electrode of the charge storage capacitor 5 is grounded via a line (not illustrated) and made to be ground level. Note that, in FIG. 1, the one electrode of the charge storage capacitor 5 is illustrated as being connected to ground.

At the TFT active matrix substrate 10, a common line 110 is provided at the peripheral edge of the substrate so as to surround all of the pixels that are provided in the two-dimensional form. The common line 110 and the respective scan lines 101, and the common line 110 and respective data lines 3, are connected by bidirectional diodes 30 for protection at the intersecting portions of the respective lines.

Due to any of the TFT switches 4 that are connected to the data line 3 being turned on, an electric signal corresponding to the charge amount of the charges stored in the charge storage capacitor 5 flows to the data line 3. A signal detecting circuit 105, that detects the electric signals that flow-out to the data lines 3, is connected to the respective data lines 3. A scan signal controlling device 104, that outputs control signals for turning the TFT switches 4 on and off to the scan lines 101, is connected to the respective scan lines 101.

The signal detecting circuit 105 incorporates therein, for each of the data lines 3, an amplifying circuit that amplifies the inputted electric signal. At the signal detecting circuit 105, due to the electrical signals that are inputted from the respective data lines 3 being amplified by the amplifying circuits and detected, the signal detecting circuit 105 detects the charge amounts stored in the respective charge storage capacitors 5 as information of the respective pixels structuring the image.

A signal processing device 106 is connected to the signal detecting circuit 105 and the scan signal controlling device 104. The signal processing device 106 carries out predetermined processings on the electrical signals detected at the signal detecting circuit 105, and outputs control signals expressing signal detecting timings to the signal detecting circuit 105, and outputs control signals expressing scan signal outputting timings to the scan signal controlling device 104.

Figure 2:
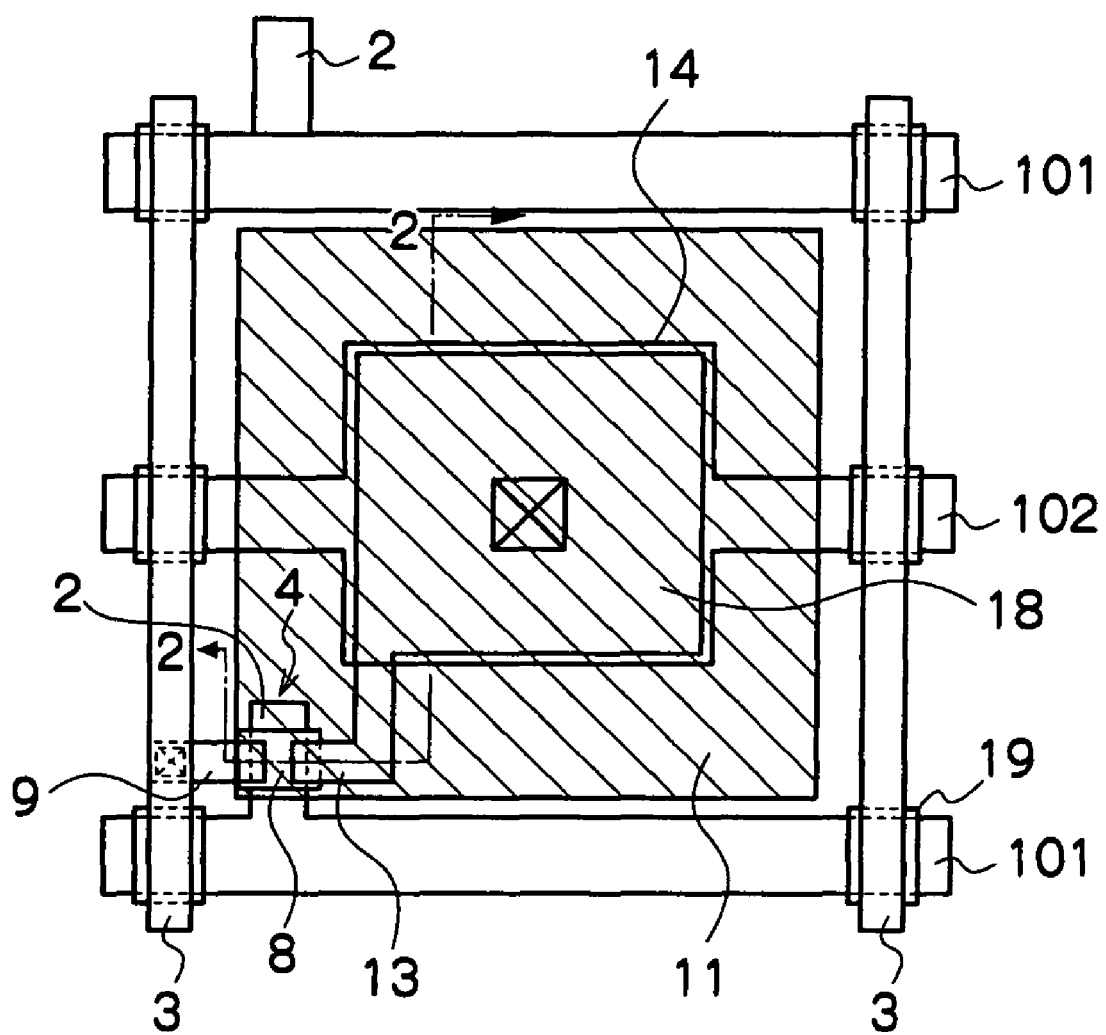
FIG. 2 is a plan view showing the structure of one pixel unit of a TFT active matrix substrate relating to the first and second exemplary embodiments.

Next, the TFT active matrix substrate 10 relating to the present exemplary embodiment will be described in further detail with reference to FIG. 2 and FIG. 3. FIG. 2 shows a plan view showing the structure of one pixel unit of the TFT active matrix substrate 10 relating to the present exemplary embodiment, and FIG. 3 shows a sectional view along line 2-2 of FIG. 2.

Figure 3:
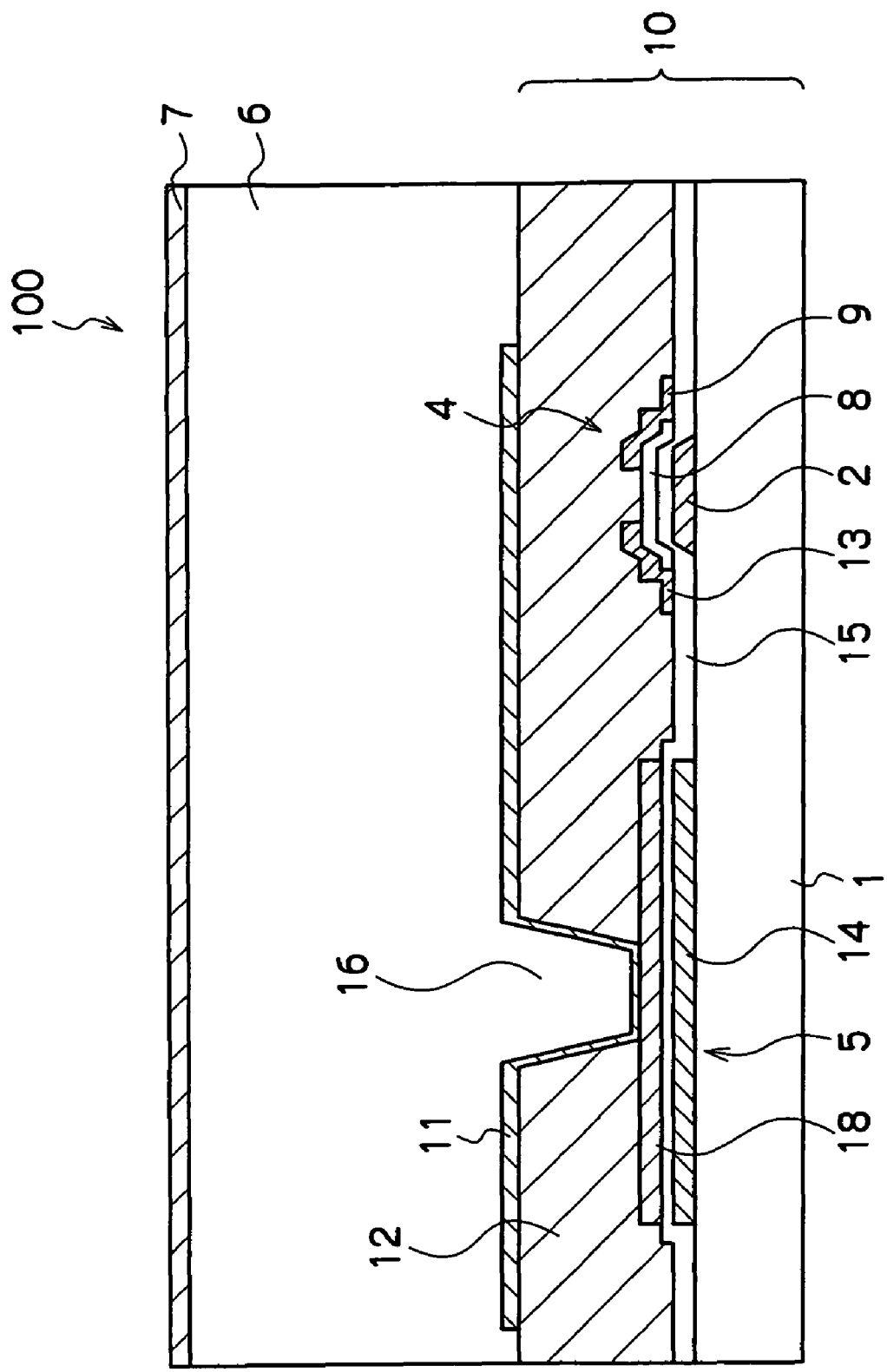
FIG. 3 is a sectional view along line 2-2 of FIG. 2 relating to the first and second exemplary embodiments.

As shown in FIG. 3, a semiconductor film 6 that is electromagnetic wave conductive, and a bias electrode 7 that is connected to a high voltage power source (not illustrated), are successively formed on the TFT active matrix substrate 10 relating to the present exemplary embodiment. The semiconductor film 6 generates charges (electrons-holes) at the interior thereof, due to electromagnetic waves such as X-rays or the like being irradiated. Namely, the semiconductor film 6 is electromagnetic wave conductive, and is for converting the image information by the X-rays into charge information. Further, the semiconductor film 6 is formed from, for example, a-Se (amorphous selenium) whose main component is selenium. Here, main component means having a content of greater than or equal to 50%.

The layer structure of the TFT active matrix substrate 10 relating to the present exemplary embodiment will be described in further detail hereinafter.

The TFT active matrix substrate 10 has a glass substrate 1, a gate electrode 2, a storage capacitor lower electrode 14, a gate insulating film 15, a semiconductor layer 8, a source electrode 9, a drain electrode 13, a storage capacitor upper electrode 18, an interlayer insulating film 12, and a charge collecting electrode 11. Note that, as shown in FIG. 2, the scan line 101 is connected to the gate electrode 2, and the gate electrode 2 and the scan line 101 are formed from the same metal layer. Further, a storage capacitor line 102 is connected to the storage capacitor lower electrode 14. Thus, the storage capacitor lower electrode 14 and the storage capacitor line 102 are formed from the same metal layer.

At the TFT active matrix substrate 10 relating to the present exemplary embodiment, the TFT switch 4 is structured by the gate electrode 2, the gate insulating film 15, the source electrode 9, the drain electrode 13 and the semiconductor layer 8. The charge storage capacitor 5 is structured by the storage capacitor lower electrode 14, the gate insulating film 15 and the storage capacitor upper electrode 18.

The glass substrate 1 is a supporting substrate. For example, an alkaline-free glass substrate (e.g., #1737 manufactured by Corning Incorporated, or the like) can be used as the glass substrate 1. The scan lines 101 and the data lines 3 are electrode lines that are arrayed in the form of a grid as shown in FIG. 1. The TFT switches 4 are formed at the points of intersection thereof, as shown in FIG. 2. The TFT switch 4 is a switching element. The source electrode 9 thereof is connected to the data line 3 via a contact hole, and the drain electrode 13 is connected to the storage capacitor upper electrode 18.

The gate insulating film 15 is formed from $SiN_X$, $SiO_X$, or the like. The gate insulating film 15 is provided so as to cover the gate electrode 2, the scan line 101, the storage capacitor lower electrode 14 and the storage capacitor line 102. The region of the gate insulating film 15, which region is positioned above the gate electrode 2, functions as a gate insulating film at the TFT switch 4. The region of the gate insulating film 15, which region is positioned above the storage capacitor lower electrode 14, functions as a dielectric layer at the charge storage capacitor 5. Namely, the charge storage capacitor 5 is formed by the overlapping region of the storage capacitor upper electrode 18 and the storage capacitor lower electrode 14 that is formed in the same layer as the gate electrode 2.

The semiconductor layer 8 is the channel portion of the TFT switch 4, and is a current path connecting the source electrode 9, which is connected to the data line 3, and the drain electrode 13, that is connected to the storage capacitor upper electrode 18.

The interlayer insulating film 12 is formed over substantially the entire surface of the region (substantially the entire region) where the pixels are provided on the glass substrate 1. The interlayer insulating film 12 is formed from an acrylic resin that is photosensitive, and aims for electrical isolation and separation of the TFT switch 4. In this way, the interlayer insulating film 12 protects the drain electrode 13 and the source electrode 9, and is for electrical isolation and separation. Further, the interlayer insulating film 12 has a contact hole 16 in the region positioned above the portion facing the storage capacitor lower electrode 14.

The charge collecting electrode 11 is formed from an amorphous, transparent, electrically-conductive oxide film (ITO). The charge collecting electrode 11 is formed on the interlayer insulating film 12 so as to cover the pixel region, while filling-in the contact hole 16. The charge collecting electrode 11 and the semiconductor film 6 are electrically conductive, and the charges generated at the semiconductor film 6 can be collected at the charge collecting electrode 11.

The gate electrode 2, the scan line 101, the storage capacitor lower electrode 14 and the storage capacitor line 102 are provided on the glass substrate 1. The semiconductor layer 8 is formed above the gate electrode 2, via the gate insulating film 15. The source electrode 9 and the drain electrode 13 are formed on the semiconductor layer 8. The storage capacitor upper electrode 18 is layered above the layer that structures the charge storage capacitor 5. Further, the interlayer insulating film 12 is disposed above the storage capacitor upper electrode 18, the source electrode 9 and the drain electrode 13.

The charge collecting electrode 11 is provided at the top layer of the interlayer insulating film 12. The charge collecting electrode 11 and the TFT switch 4 are connected via the storage capacitor upper electrode 18.

A high voltage power source (not illustrated) is connected between the bias electrode 7 and the storage capacitor lower electrode 14.

Next, the principles of operation of the radiation image detecting device 100 having the above-described structure will be explained simply.

Figure 4:
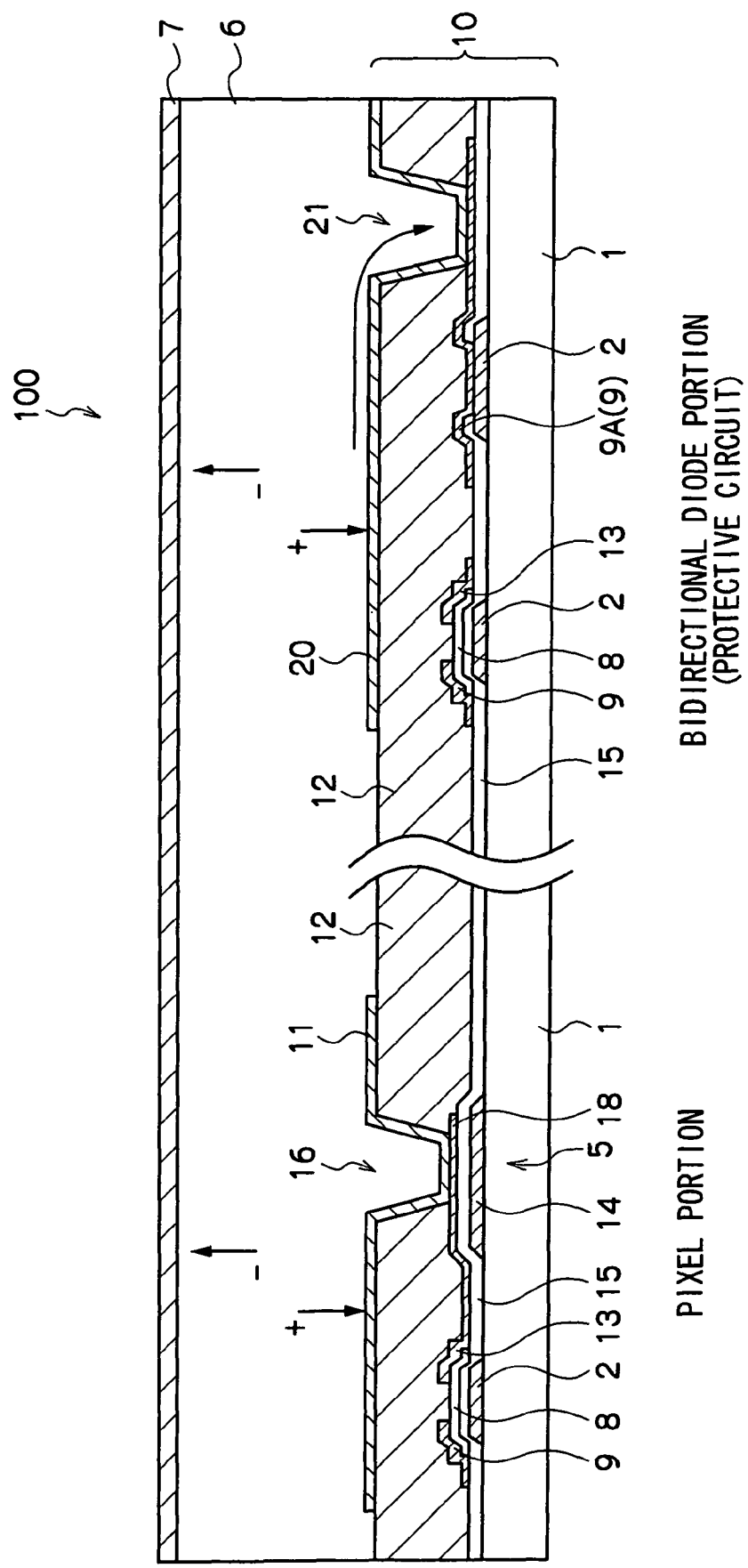
FIG. 4 is a schematic diagram showing the states within the layers of a pixel portion and a bidirectional diode portion at a time of operation of the TFT active matrix substrate relating to the first exemplary embodiment.

The layer structures of the pixel portion that detects the image and the bidirectional diode 30 portion of the TFT active matrix substrate 10 are shown as being arranged side-by-side in FIG. 4.

As shown in FIG. 4, when X-rays are irradiated onto the semiconductor film 6 in a state in which voltage is applied between the bias electrode 7 and the storage capacitor lower electrode 14, charges (electron-hole pairs) are generated within the semiconductor film 6. The semiconductor film 6 and the charge storage capacitor 5 are structured so as to be connected in series. Therefore, the electrons generated within the semiconductor film 6 move toward the + (positive) electrode side and the holes move toward the − (negative) electrode side, and as a result, charges are stored in the charge storage capacitor 5.

Due to the TFT switch 4 (see FIG. 1) being turned ON by an input signal to the scan line 101, the charges stored in the charge storage capacitor 5 can be read-out to the exterior via the data line 3.

In the radiation image detecting device 100, the scan lines 101, the data lines 3, the TFT switches 4 and the charge storage capacitors 5 are all provided in the form of an XY matrix. Therefore, two-dimensional image information by X-rays can be obtained due to the signals inputted to the scan lines 101 being successively scanned and the signals from the data lines 3 being sensed per data line 3.

At the TFT active matrix substrate 10 relating to the present exemplary embodiment, the respective scan lines 101 and the respective data lines 3 are connected to the common line 110 via bidirectional diodes 30 respectively, in order to prevent electrostatic breakage due to static electricity generated at the time of manufacturing an FPD or the like. Due thereto, in a case in which a high voltage is applied to the scan lines 101 and the respective data lines 3 due to static electricity or the like, the high voltage is prevented from being applied to the insulating film due to the charges escaping to the common line 110 via the bidirectional diodes 30.

However, because the semiconductor film 6 functions as a back gate, the bidirectional diodes 30 of the present exemplary embodiment have the characteristic that, the greater the charge amount stored in the semiconductor film 6 without being collected, the more the resistance values decreases. Therefore, when the charge amount that is stored in the semiconductor film 6 becomes great, there are cases in which leak current flows through the bidirectional diodes 30 via the common line 110 between the respective data lines 3, and the signal values of the data lines 3 detected at the signal detecting circuit 105 fluctuate.

Thus, in the TFT active matrix substrate 10 relating to the present exemplary embodiment, it is made harder for leak current to flow between the respective data lines 3, by changing the structure of the respective bidirectional diode 30 portions.

Figure 5:
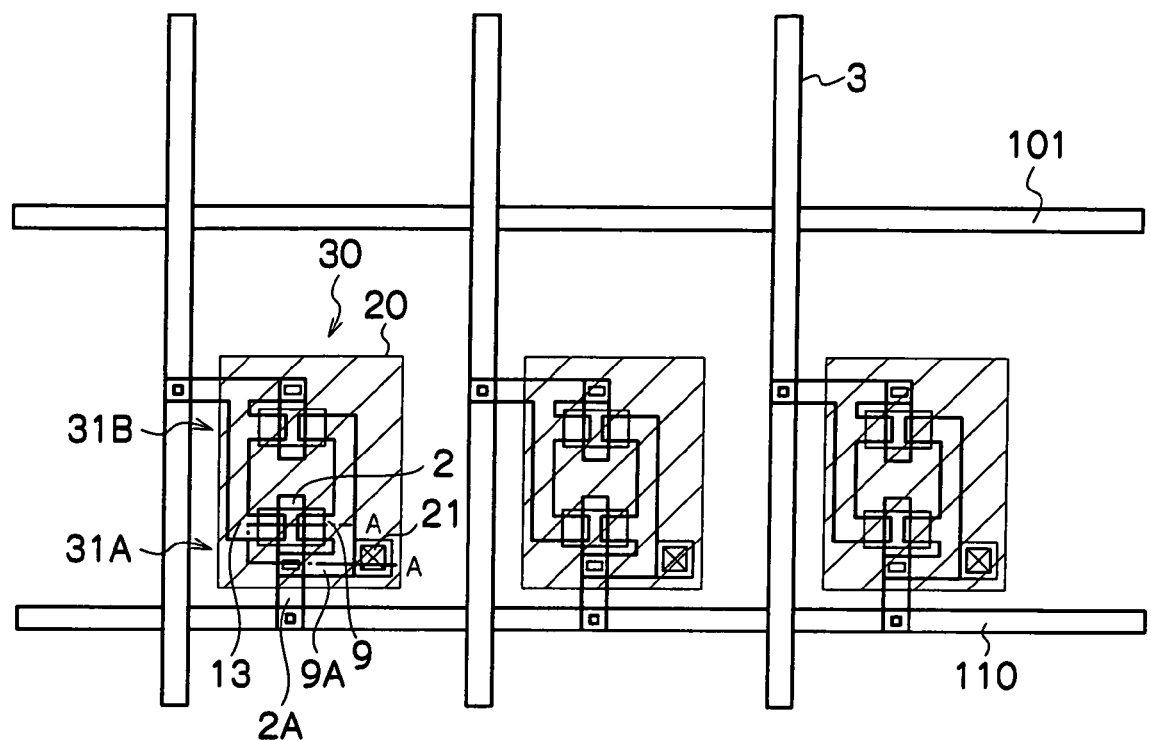
FIG. 5 is a plan view showing the structure of a bidirectional diode relating to the first exemplary embodiment.
Figure 6:
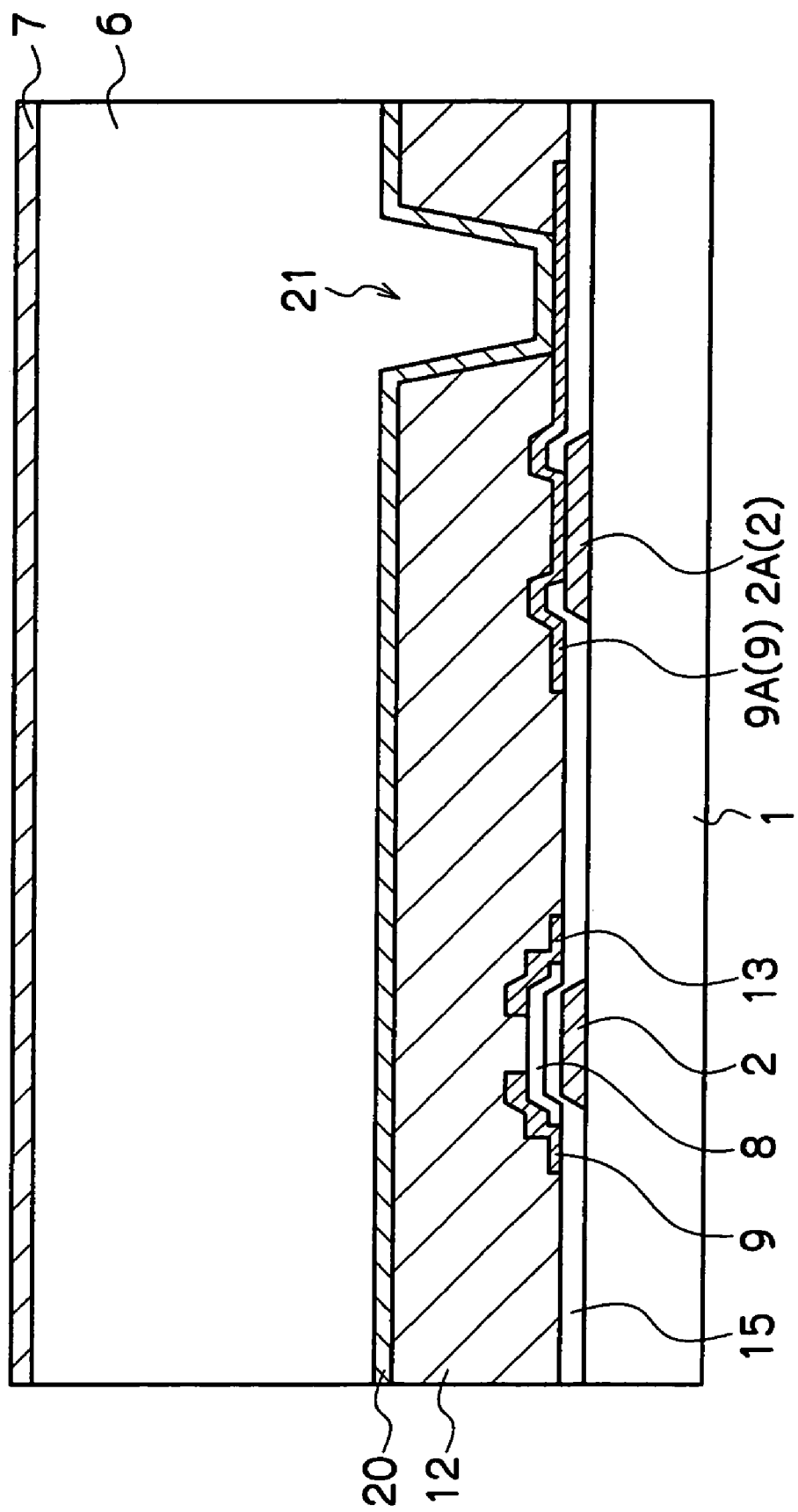
FIG. 6 is a sectional view along line A-A of FIG. 5 relating to the first exemplary embodiment.

The structure of the bidirectional diode 30 relating to the present exemplary embodiment is shown in FIG. 5 and FIG. 6. FIG. 5 is a plan view showing the structure of the bidirectional diode 30, and FIG. 6 is a sectional view showing the cross-section along line A-A of one diode 31A that structures the bidirectional diode 30 shown in FIG. 5.

As shown in FIG. 6, the diode 31A is structured by the gate electrode 2, the gate insulating film 15, and the semiconductor layer 8 being successively deposited on the glass substrate 1. Further, the source electrode 9 and the drain electrode 13 are formed on the semiconductor layer 8. The region of the semiconductor layer 8 between the source electrode 9 and the drain electrode 13 functions as a TFT channel portion. The interlayer insulating film 12 is formed so as to cover the channel portion, the source electrode 9 and the drain electrode 13.

In the TFT active matrix substrate 10 relating to the present exemplary embodiment, as shown in FIG. 5, shield electrodes 20 are disposed at the layer above the bidirectional diodes 30. The shield electrodes 20 are formed of the material of the same layer as the charge collecting electrodes 11 (ITO in the present exemplary embodiment), so as to cover the respective bidirectional diodes 30. The shield electrodes 20 are connected to source line layer metals 9A via contact holes 21 that are formed in the interlayer insulating films 12. The source line layer metals 9A are electrically connected to the common line 110 via gate line metals 2A (see FIG. 5). Accordingly, the shield electrodes 20 are electrically connected to the common line 110. Note that the shield electrodes 20 are connected to the source line layer metals 9A in the present exemplary embodiment, but may be connected to the gate line metals 2A, or may be electrically connected to the common line 110 via metals of another layer, or may be electrically connected directly to the common line 110. It suffices for the shield electrodes 20 to be electrically connected to the common line 110.

In the present exemplary embodiment, the shield electrodes 20 are disposed on the interlayer insulating films 12, in the same way as the charge collecting electrodes 11. However, the shield electrodes 20 that are formed from ITO may be disposed directly, without providing the interlayer insulating films 12. In this case, an inorganic insulating film must be provided so as to cover the source electrodes 9 and the drain electrodes 13.

Further, the shield electrodes 20 may be formed of another metal material other than ITO. An increase in signal line capacitance is related to an increase in noise. Therefore, by forming the shield electrodes 20 of ITO on the interlayer insulating films 12 as in the present exemplary embodiment, the parasitic capacitance can be made to be small, and due thereto, the line capacitance of the signal lines can be decreased. Therefore, a structure such as that of the present exemplary embodiment is preferred.

Operation of the radiation image detecting device 100 relating to the present exemplary embodiment will be described next.

As shown in above-described FIG. 4, when the X-rays are irradiated onto the semiconductor film 6 in a state in which voltage is applied between the bias electrode 7 and the storage capacitor lower electrode 14, charges (electron-hole pairs) are generated within the semiconductor film 6. The generated charges are stored at the interface between the interlayer insulating film 12 and the semiconductor film 6, or at the defect level of the interior of the semiconductor film 6.

However, because the shield electrode 20 is disposed above the bidirectional diode 30 at the TFT active matrix substrate 10 relating to the present exemplary embodiment, the generated charges flow to the common line 110 via the shield electrode 20.

Accordingly, in the present exemplary embodiment, the charges, that are stored in the semiconductor film 6 without being collected by the charge collecting electrode 11, are collected by the shield electrode 20, and the charges flow through the common line 110, and the potential of the shield electrode 20 approaches the common electrode potential (GND). Due thereto, malfunctioning of the bidirectional diode 30 can be prevented, and an increase in noise and generation of artifacts due to leak current can be prevented.

Further, at the TFT active matrix substrate 10 relating to the present exemplary embodiment, by providing the shield electrode 20, the potential on the TFT structuring the bidirectional diode 30 can always be maintained at GND at the time of image detection. Therefore, fluctuations in signal line noise due to changes in the X-ray irradiation amount or the bias voltage can be prevented, and high image quality can be maintained stably.

As described above in detail, in accordance with the present exemplary embodiment, due to the shield electrode 20 collecting the charges that are stored in the semiconductor film 6 without being collected, a decrease in the resistance value of the bidirectional diode 30 is suppressed, and the generation of leak current via the bidirectional diode 30 can be suppressed. Therefore, the generation of artifacts and an increase in noise can be suppressed.

Moreover, in accordance with the present exemplary embodiment, the bidirectional diodes 30 are provided respectively at both the data line 3 side and at the scan line 101 side. Due thereto, the generation of leak current from the scan line 101 side can be suppressed, and therefore, reading-out of the image is stable.

Second Exemplary Embodiment

The overall structure of the radiation image detecting device 100 relating to a second exemplary embodiment and the detailed structure of the TFT active matrix substrate 10 are, other than the structure of the bidirectional diode 30 being different, the same as in the above-described first exemplary embodiment (see FIG. 1, FIG. 2 and FIG. 3), and therefore, description thereof is omitted here.

Figure 7:
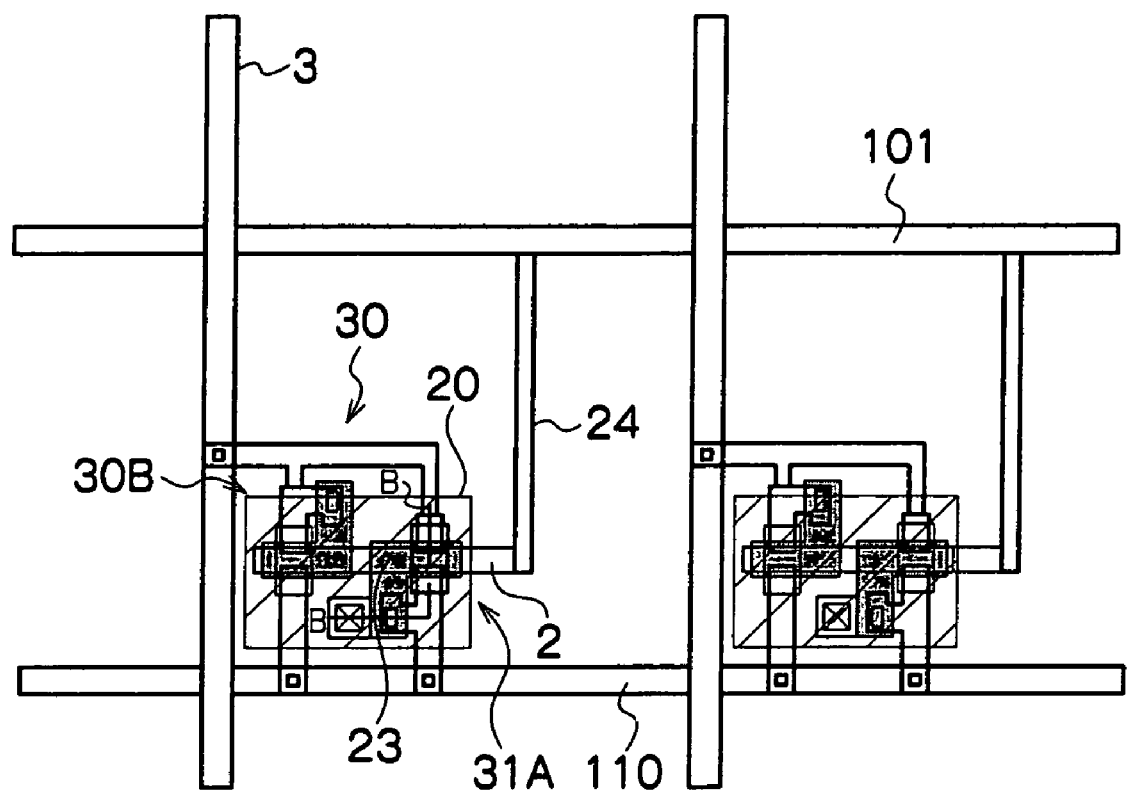
FIG. 7 is a plan view showing the structure of a bidirectional diode relating to the second exemplary embodiment.
Figure 8:
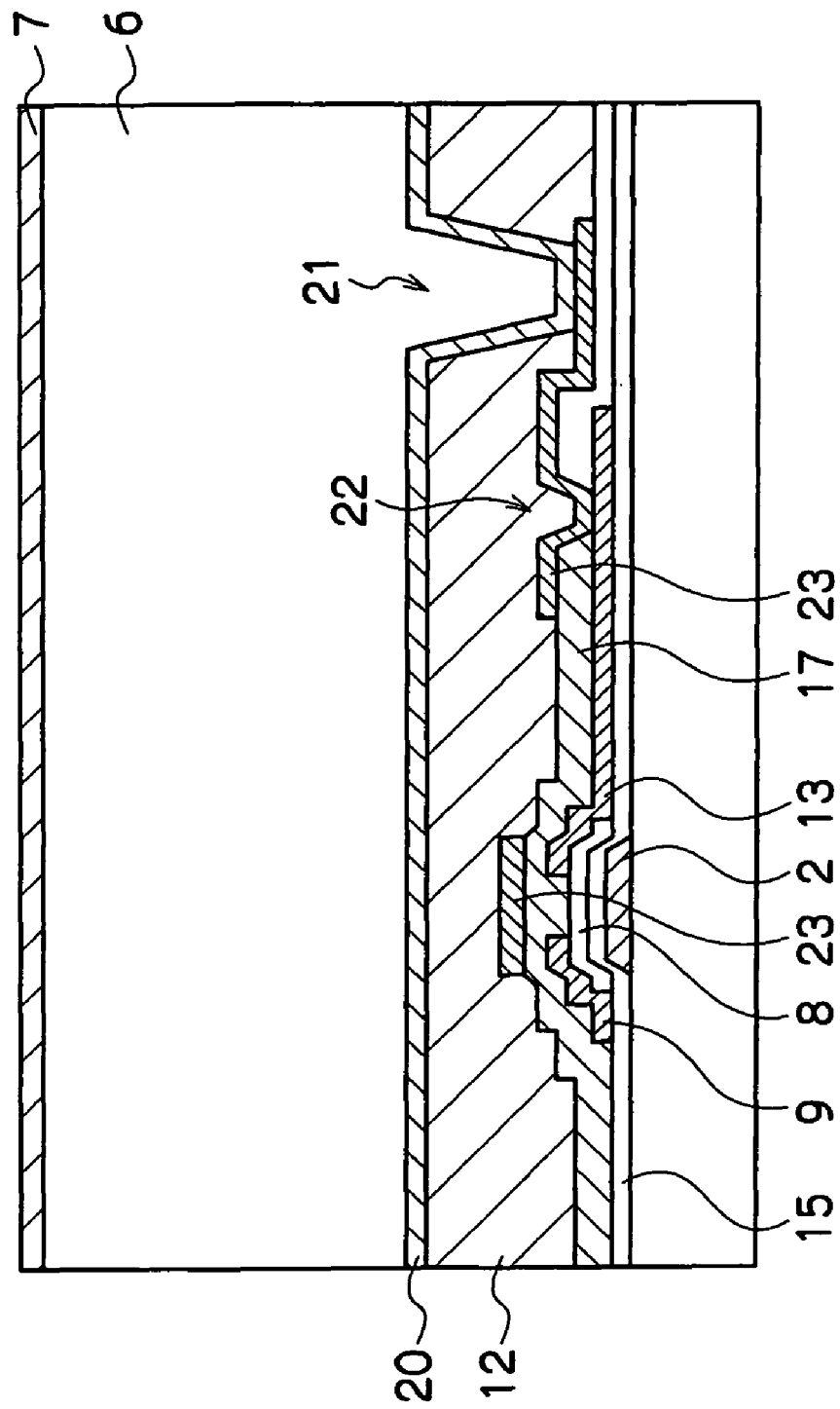
FIG. 8 is a sectional view along line A-A of FIG. 7 relating to the second exemplary embodiment.

The structure of the bidirectional diode 30 relating to the present exemplary embodiment is shown in FIG. 7 and FIG. 8. Note that FIG. 7 is a plan view showing the structure of the bidirectional diode 30, and FIG. 8 is a sectional view showing the cross-section along line B-B of the one diode 31A structuring the bidirectional diode 30 shown in FIG. 7.

As shown in FIG. 8, at the diode 31A, an insulating protective film 17 is formed above the source electrode 9 and the drain electrode 13, and a contact hole 22 is formed in the insulating protective film 17. Further, back gate electrodes 23 are deposited and formed on the insulating protective film 17 so as to fill-in the contact hole 22 and so as to cover the region corresponding to the gate electrode 2, the semiconductor layer 8, the source electrode 9 and the drain electrode 13. The back gate electrodes 23 are connected to the drain electrode 13 via the contact hole 22, and the drain electrode 13 is connected to the gate electrode 2 via a contact hole.

The gate electrode 2 is connected to the adjacent scan line 101 by a connecting line 24 (see FIG. 7).

The shield electrode 20 is formed at the layer above the bidirectional diode 30, so as to cover the bidirectional diode 30. The shield electrode 20 is connected to the back gate electrodes 23 via the contact hole 21 formed-in the interlayer insulating film 12.

Next, the principles of operation of the radiation image detecting device 100 having the above-described structure will be described.

In the radiation image detecting device 100 relating to the second exemplary embodiment, at the time of image detection, off potential (e.g., −3.3 V) is applied from the scan signal controlling device 104 to the back gate electrodes 23 via the scan line 101. In a case in which voltage is applied from the scan line 101 via the gate electrode 2 and the drain electrode 13, and the back gate electrodes 23 are maintained at the OFF potential, the resistance value of the bidirectional diode 30 becomes high, and current does not flow even if high voltage is applied to the data line 3.

On the other hand, at the time of manufacturing the TFT active matrix substrate 10, in a case in which the voltage level of the scan line 101 is made to be 0 V and the back gate electrodes 23 are made to be 0 V, the resistance value of the bidirectional diode 30 becomes low, and current flows when high voltage is applied to the data line 3 due to static electricity or the like arising. Due thereto, the effect of insulating film breakage due to static electricity is reduced.

However, the bidirectional diode 30 relating to the present exemplary embodiment has the characteristic that, the greater the charge amount that is stored in the semiconductor film 6 without being collected, the lower the resistance value.

Therefore, when the charge amount stored in the semiconductor film 6 becomes great, leak current flows between the respective data lines 3 via the common line 110, and there are cases in which the signal values of the data lines 3 detected at the signal detecting circuit 105 fluctuate.

However, in the TFT active matrix substrate 10 relating to the present exemplary embodiment, the shield electrode 20 is disposed above the bidirectional diode 30. Due thereto, the generated charges flow to the common line 110 via the shield electrode 20. Therefore, malfunctioning of the bidirectional diode 30 can be prevented, and an increase in noise and generation of artifacts due to leak current can be prevented.

As described above in detail, in accordance with the present exemplary embodiment, even in a case in which the bidirectional transistor 30 is structured by a back gate type field effect transistor, the charges, that are stored in the semiconductor film 6 without being collected, are collected by the shield electrode 20. A decrease in the resistance value of the bidirectional diode 30 is thereby suppressed, and therefore, the occurrence of artifacts and an increase in noise can be suppressed.

Third Exemplary Embodiment

Because the detailed structure of the overall structure of the radiation image detecting device 100 relating to a third exemplary embodiment is the same as that of the above-described first exemplary embodiment (see FIG. 1), description thereof will be omitted here.

Figure 9:
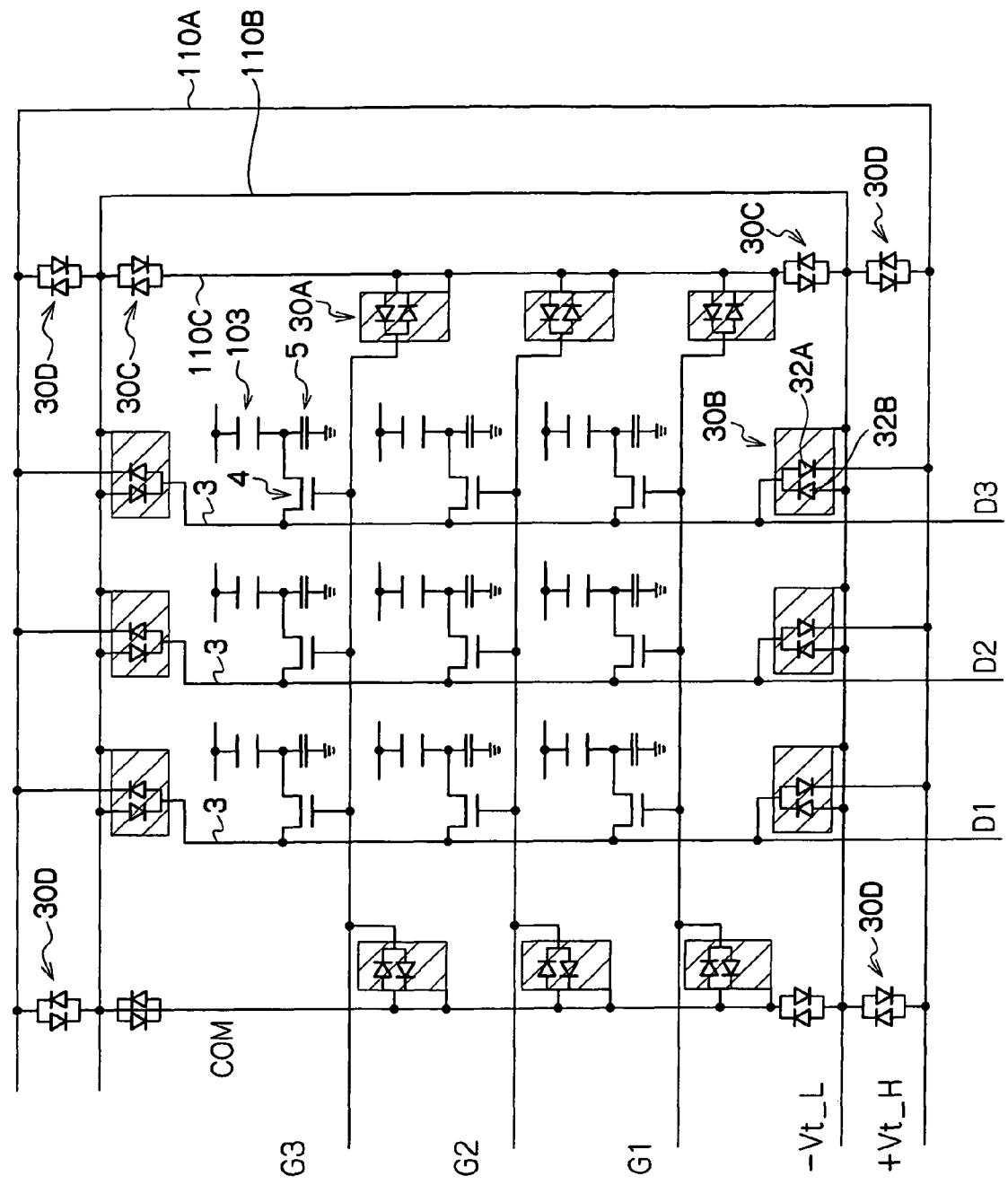
FIG. 9 is a structural drawing showing the overall structure of a TFT active matrix substrate relating to a third exemplary embodiment.

The detailed structure of the TFT active matrix substrate 10 relating to the present exemplary embodiment is shown in FIG. 9. Note that description of portions in FIG. 9 that are the same as FIG. 1 is omitted.

Two common lines 110A, 110B are provided at the TFT active matrix substrate 10 relating to the present exemplary embodiment, at the peripheral edge of the substrate so as to surround all of the pixels that are provided in a two-dimensional form.

The common lines 110A, 110B are connected to a power source circuit (not illustrated). Voltage +Vt_H that is positive potential is applied from the power source circuit to the common line 110A, whereas voltage −Vt_L that is negative potential is applied to the common line 110B.

A bidirectional diode 30B, that is structured such that the anodes and cathodes of two diodes 32A, 32B are respectively connected to one another in parallel, is provided at both end portions of each of the data lines 3. The anodes of the respective diodes 32A and the cathodes of the respective diodes 32B are respectively connected in parallel to the data lines 3. The cathodes of the respective diodes 32A are connected to the common line 110A, and the anodes of the respective diodes 32B are connected to the common line 110B.

Further, a bidirectional diode 30A, that is structured such that the anodes and cathodes of the two diodes 31A, 31B are respectively connected to one another in parallel, is provided at both end portions of each of the scan lines 101. The respective scan lines 101 are connected to lines 110C via the bidirectional diodes 30A. Bidirectional diodes 30C are provided at both ends of the lines 110C. The lines 110C are connected to the common line 110B via the bidirectional diodes 30C.

Bidirectional diodes 30D are provided respectively at the four corner portions of the peripheral edge of the substrate. The common line 110A and the common line 110B are connected by the bidirectional diodes 30D at the four corner portions.

In the TFT active matrix substrate 10 relating to the present exemplary embodiment, the bidirectional diodes 30A, 30B, 30C, 30D are structured similarly. Therefore, in the following explanation, only the bidirectional diode 30B will be described.

Figure 10:
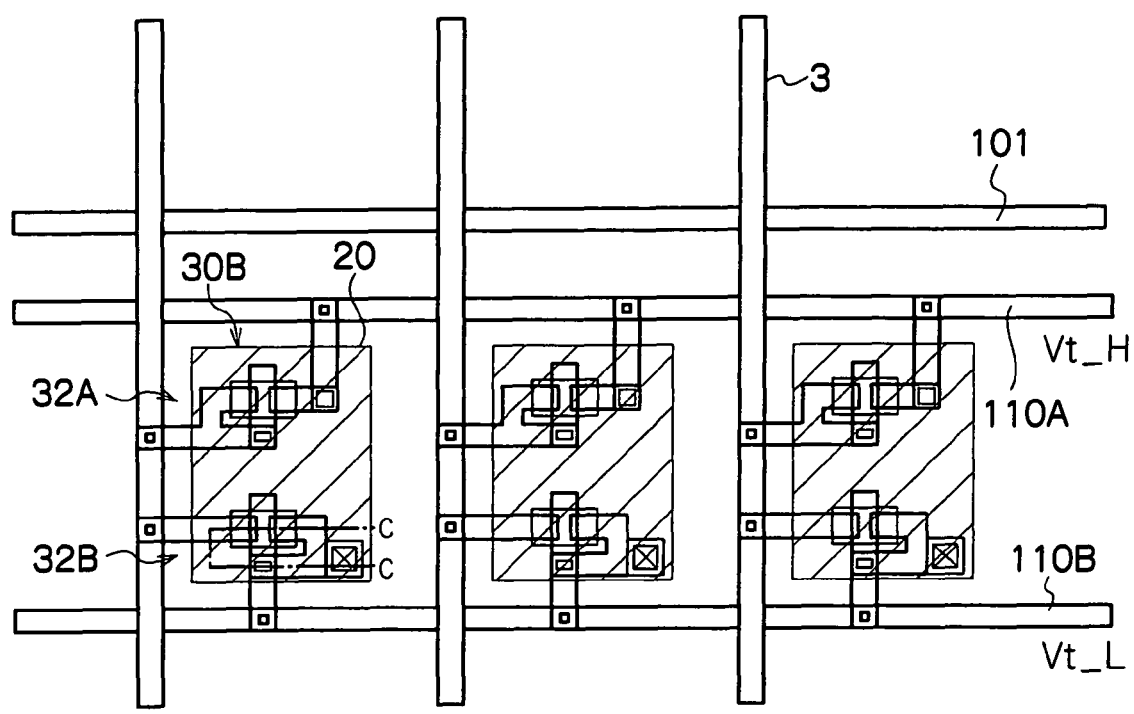
FIG. 10 is a plan view showing the structure of a bidirectional diode relating to the third exemplary embodiment.
Figure 11:
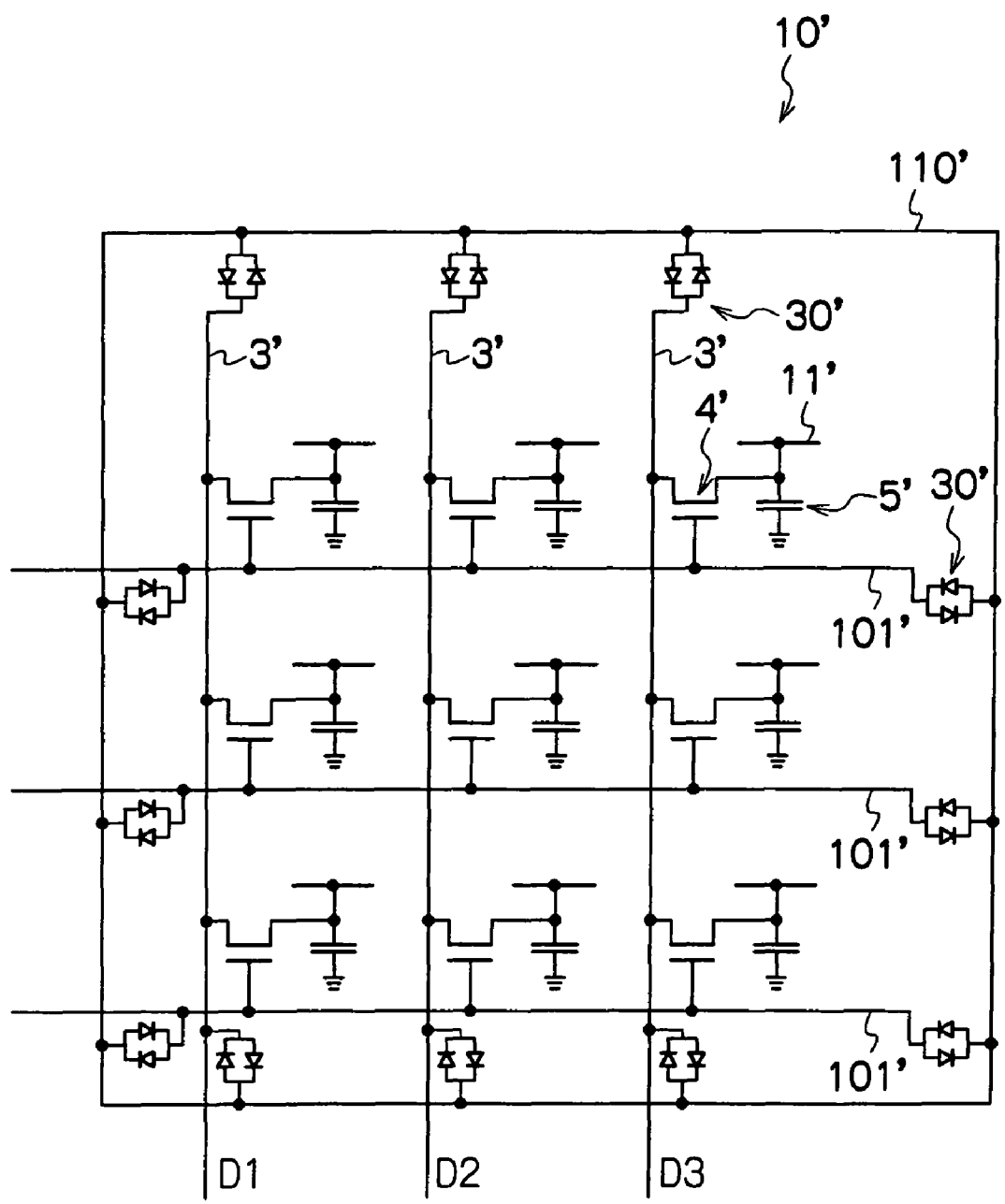
FIG. 11 is a structural drawing showing the structure of a conventional TFT active matrix substrate.
Figure 12:
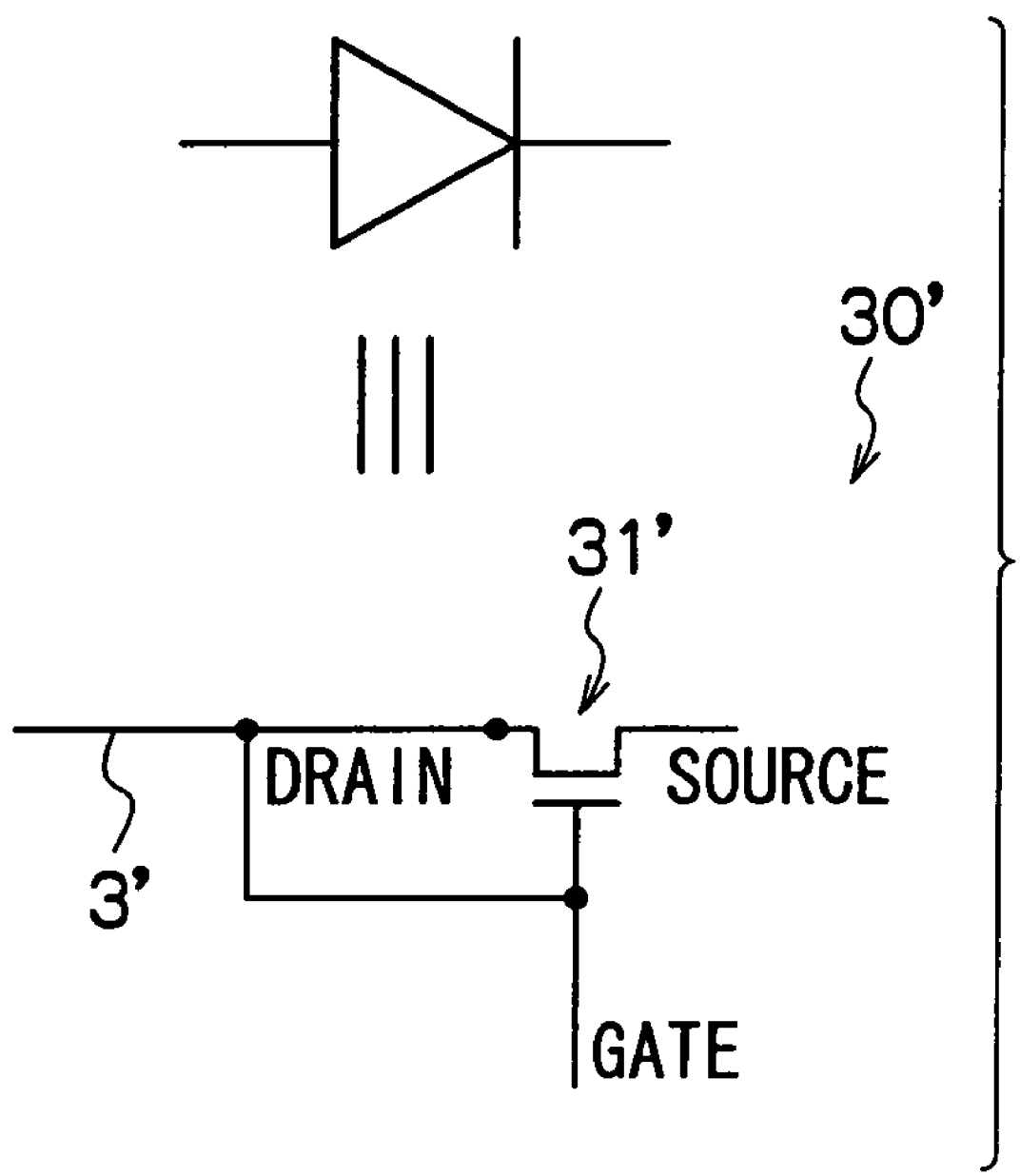
FIG. 12 is a structural drawing showing the structure of one diode structuring a conventional bidirectional diode.
Figure 13:
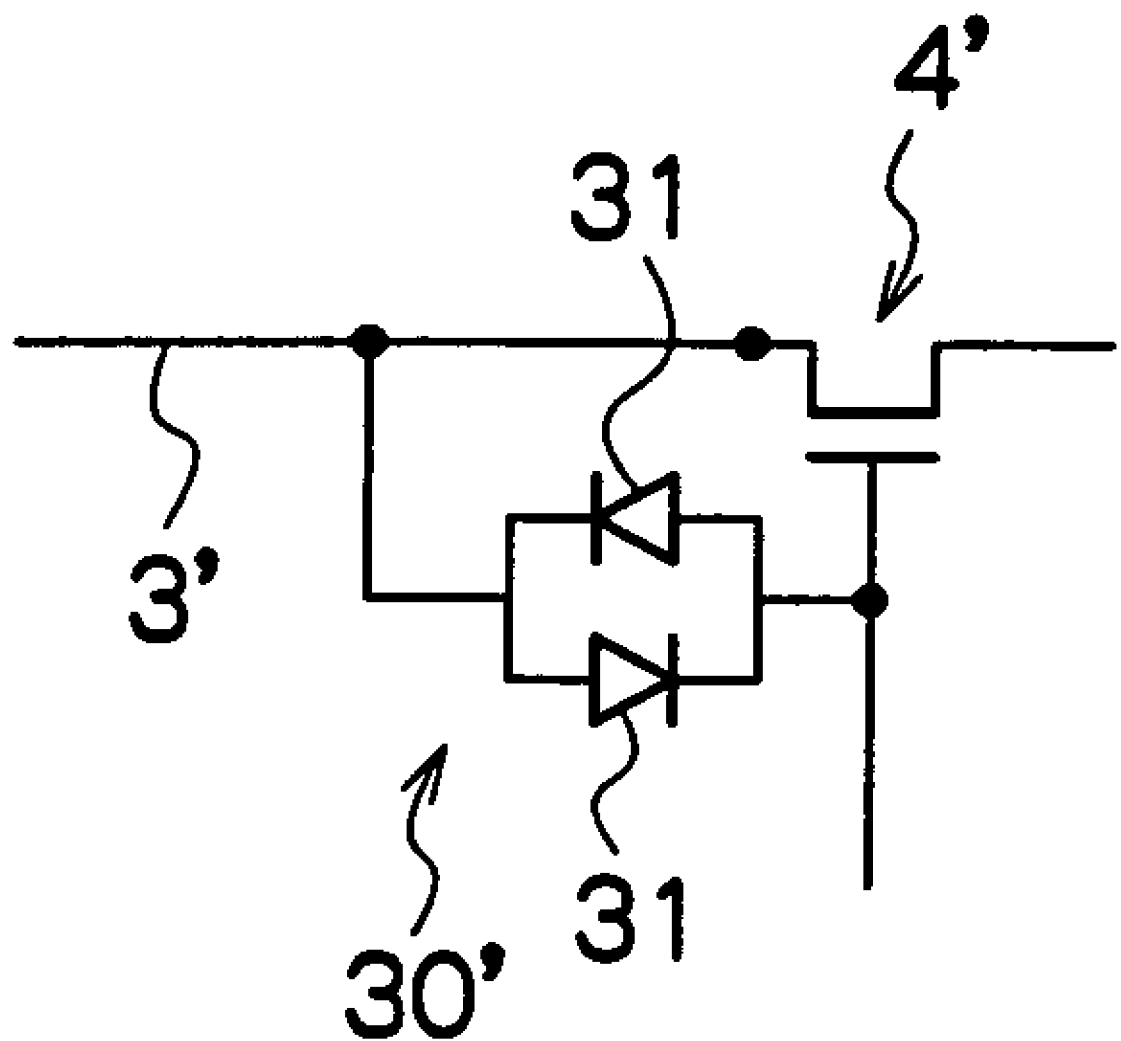
FIG. 13 is a circuit diagram showing an equivalent circuit and focusing on one TFT element of the conventional TFT active matrix substrate.
Figure 14:
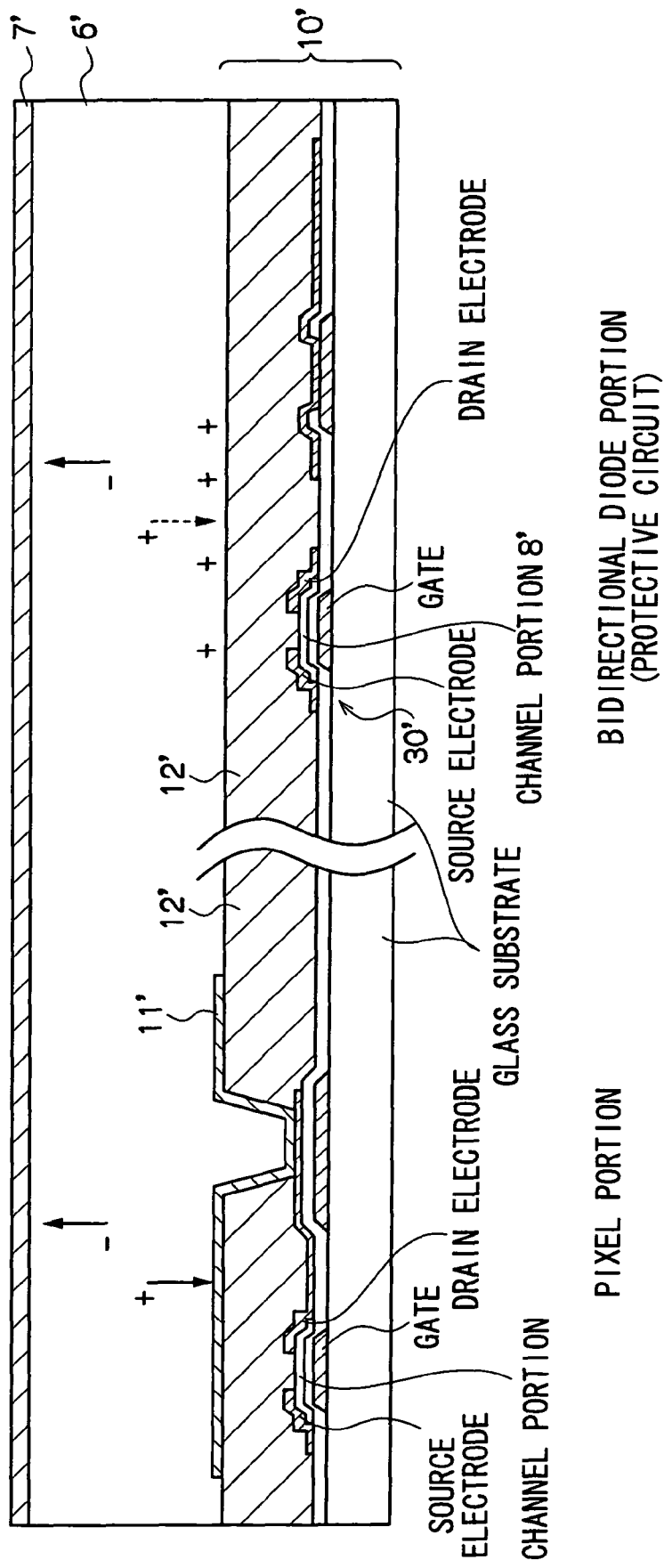
FIG. 14 is a schematic drawing showing the states within the layers of a pixel portion and a bidirectional diode portion at a time of operation of the conventional TFT active matrix substrate.

The structure of the bidirectional diode 30B relating to the present exemplary embodiment is shown in FIG. 10.

The cross-section, along line C-C, of the one diode 32B structuring the bidirectional diode 30B is a structure similar to that of above-described FIG. 6. The shield electrode 20 is formed at the layer above the bidirectional diode 30B so as to cover the bidirectional diode 30B.

Next, principles of operation of the radiation image detecting device 100 of the above-described structure will be described.

At the TFT active matrix substrate 10 relating to the present exemplary embodiment, in a case in which a positive high voltage is applied to the respective data lines 3 due to static electricity or the like, current flows to the common line 110B via the diodes 32B. In a case in which a negative high voltage is applied to the respective data lines 3 due to static electricity or the like, current flows from the common line 110A via the diodes 32A. High voltage is thereby prevented from being applied to the insulating film.

Further, in a case in which a positive or a negative high voltage is applied to the respective scan lines 101 due to static electricity or the like, current flows to the common line 110B via the bidirectional diodes 30A, the lines 110C and the bidirectional diodes 30C. High voltage is thereby prevented from being applied to the insulating film.

On the other hand, at the data lines 3, at the time of actual driving, due to static electricity or due to charges that are greater than or equal to those supposed in advance being stored in the charge storage capacitors 5, there are cases in which a potential difference arises between the respective signal lines, and leak current flows from the respective data lines 3 to the common line 110A.

However, in the TFT active matrix substrate 10 relating to the present exemplary embodiment, the common line is divided into the two lines that are the common lines 110A, 110B. By making the line to which the leak current flows differ in the case in which a positive high voltage is applied to the respective data lines 3 and in the case in which negative high voltage is applied, fluctuations in the signal values due to leak current at the time of driving can be suppressed.

However, the bidirectional diodes 30A, 30B relating to the present exemplary embodiment have the characteristic that, the greater the charge amount that is stored in the semiconductor film 6 without being collected, the more the resistance value decreases. Therefore, if the charge amount stored in the semiconductor film 6 becomes large, leak current flows via the respective common lines 110A, 110B, 110C, and there are cases in which the signal values of the data lines 3 detected at the signal detecting circuit 105 fluctuate.

However, in the TFT active matrix substrate 10 relating to the present exemplary embodiment, the shield electrodes 20 are disposed above the bidirectional diodes 30A and the bidirectional diodes 30B. Due thereto, malfunctioning of the bidirectional diode 30A and the bidirectional diode 30B can be prevented, and an increase in noise and generation of artifacts due to leak current can be prevented.

As described above in detail, in accordance with the present exemplary embodiment, even in a case in which the bidirectional diode 30 is connected to plural common lines, due to the shield electrode 20 collecting the charges that are stored in the semiconductor film 6 without being collected, a decrease in the resistance value of the bidirectional diode 30 is suppressed. Therefore, the occurrence of artifacts and an increase in noise can be suppressed.

In accordance with the above-described respective exemplary embodiments, because the shield electrode 20 is formed at the same layer as the layer forming the charge collecting electrode 11, the shield electrode 20 can be formed without increasing the number of processes.

Note that, in the above-described respective exemplary embodiments, a case is described in which the present invention is applied to the radiation image detecting device 100 that detects an image by detecting X-rays as electromagnetic waves that are the object of detection. However, the present invention is not limited to the same, and the electromagnetic waves that are the object of detection may be any of, for example, visible light, ultraviolet radiation, infrared radiation, or the like.

In addition, the structure of the radiation image detecting device 100 (see FIG. 1) and the structure of the TFT active matrix substrate 10 (see FIG. 2 through FIG. 7, and FIG. 9) that were described in the above exemplary embodiments are examples, and it goes without saying that appropriate changes are possible within a scope that does not deviate from the gist of the present invention.

For example, the present exemplary embodiments may include a radiation image detecting device that has an active matrix substrate which is formed by disposing, on a silicon substrate made to have a size of an image detecting surface, CCDs (Charge-Coupled Devices) or CMOSs (Complementary Metal-Oxide Semiconductors) as an active matrix.

What is claimed is:

1. A sensor panel comprising:
   an image detecting region formed from a plurality of electromagnetic wave detecting elements;
   data lines reading-out signals from the electromagnetic wave detecting elements;
   an electrostatic protective circuit disposed at a peripheral edge of the image detecting region, and connected to the data lines; and
   a photoelectric conversion layer provided at an upper layer of the electrostatic protective circuit, and generating charges due to irradiation of electromagnetic waves, and further comprising
   shield electrodes that are:
      connected to a common line,
      disposed on an insulating film disposed on the electrostatic protective circuit,
      below the photoelectric conversion layer, and
      at a region above where the electrostatic protective circuit exists.

2. The sensor panel of claim 1, further including a plurality of scan lines at which flow control signals that control reading-out of signals from the electromagnetic wave detecting elements to the plurality of data lines,
   wherein a plurality of the electrostatic protective circuits are provided so as to be individually connected respectively to the plurality of scan lines.

3. The sensor panel of claim 1, further including a plurality of collecting electrodes that collect, at the electromagnetic wave detecting elements, charges that are generated at the photoelectric conversion layer,
   wherein the shield electrodes and the collecting electrodes are formed of the same material and at the same layer.

4. The sensor panel of claim 2, further including a plurality of collecting electrodes that collect, at the electromagnetic wave detecting elements, charges that are generated at the photoelectric conversion layer,
   wherein the shield electrodes and the collecting electrodes are formed of the same material and at the same layer.

5. An image detecting device comprising:
   a sensor panel; and
   detecting means for detecting an image, that is an object of detection, on the basis of charge amounts detected via a plurality of data lines of the sensor panel when electromagnetic waves expressing the image are irradiation onto the sensor panel,
   wherein the sensor panel includes:
   an image detecting region formed from a plurality of electromagnetic wave detecting elements;
   data lines reading-out signals from the electromagnetic wave detecting elements;
   an electrostatic protective circuit disposed at a peripheral edge of the image detecting region, and connected to the data lines; and
   a photoelectric conversion layer provided at an upper layer of the electrostatic protective circuit, and generating charges due to irradiation of electromagnetic waves, and further comprising
   shield electrodes that are:
      connected to a common line,
      disposed on an insulating film disposed on the electrostatic protective circuit,
      below the photoelectric conversion layer, and
      at a region above where the electrostatic protective circuit exists.

6. The image detecting device of claim 5, wherein the sensor panel further includes a plurality of scan lines at which flow control signals that control reading-out of signals from the electromagnetic wave detecting elements to the plurality of data lines,
   wherein a plurality of the electrostatic protective circuits are provided so as to be individually connected respectively to the plurality of scan lines.

7. The image detecting device of claim 5, wherein the sensor panel further includes a plurality of collecting electrodes that collect, at the electromagnetic wave detecting elements, charges that are generated at the photoelectric conversion layer,
   wherein the shield electrodes and the collecting electrodes are formed of the same material and at the same layer.

* * * * *